(12) United States Patent
Mikubo et al.

(10) Patent No.: US 8,514,364 B2
(45) Date of Patent: Aug. 20, 2013

(54) DUST AND DIRT RESISTANT LIQUID CRYSTAL DISPLAY DEVICE

(75) Inventors: Kazuyuki Mikubo, Minato-ku (JP);
Takeya Hashiguchi, Minato-ku (JP);
Hitoshi Sakamoto, Minato-ku (JP)

(73) Assignee: NEC Corporation, Tokyo (JP)

( * ) Notice: Subject to any disclaimer, the term of this patent is extended or adjusted under 35 U.S.C. 154(b) by 309 days.

(21) Appl. No.: 13/003,268

(22) PCT Filed: May 21, 2009

(86) PCT No.: PCT/JP2009/059345
§ 371 (c)(1),
(2), (4) Date: Jan. 7, 2011

(87) PCT Pub. No.: WO2010/004810
PCT Pub. Date: Jan. 14, 2010

(65) Prior Publication Data
US 2011/0116016 A1    May 19, 2011

(30) Foreign Application Priority Data

Jul. 9, 2008 (JP) ................................ 2008-179006
Jul. 17, 2008 (JP) ................................ 2008-186177

(51) Int. Cl.
*G02F 1/1333* (2006.01)
*G02F 1/13357* (2006.01)

(52) U.S. Cl.
USPC .......................................... 349/161; 349/58

(58) Field of Classification Search
USPC .... 349/12, 58, 70–75, 160–165; 361/679.54, 361/697, 704
See application file for complete search history.

(56) References Cited

U.S. PATENT DOCUMENTS

| | | | |
|---|---|---|---|
| 5,991,153 A * | 11/1999 | Heady et al. | ................. 361/704 |
| 6,089,739 A | 7/2000 | Yamamoto et al. | |
| 2002/0135741 A1 | 9/2002 | Lee et al. | |
| 2003/0218702 A1 | 11/2003 | Kwon et al. | |
| 2004/0000390 A1 | 1/2004 | Stadjuhar, Jr. et al. | |
| 2004/0228110 A1 | 11/2004 | Hsieh et al. | |
| 2006/0070280 A1 | 4/2006 | Yamamura et al. | |
| 2006/0238093 A1 | 10/2006 | Park et al. | |
| 2007/0008275 A1 | 1/2007 | Sugitani et al. | |

(Continued)

FOREIGN PATENT DOCUMENTS

| | | |
|---|---|---|
| EP | 1443813 A2 | 8/2004 |
| JP | 04-017232 A | 1/1992 |

(Continued)

OTHER PUBLICATIONS

Office Action issued Jun. 5, 2012 by the Japanese Patent Office in counterpart Japanese Application No. 2010-519695.

(Continued)

*Primary Examiner* — Akm Enayet Ullah
(74) *Attorney, Agent, or Firm* — Sughrue Mion, PLLC

(57) ABSTRACT

Provided is a highly reliable liquid crystal display device that prevents the penetration of a flying dust and dirt in the outside air. A liquid crystal display device (1) having a display unit housing case (2) configured to house a light source unit and a display unit, and an electronic component housing case (3) configured to house an electronic component. The liquid crystal display device (1) is tightly closed and externally disposed with heat radiation fins (6a and 6b).

14 Claims, 15 Drawing Sheets

(56) References Cited

U.S. PATENT DOCUMENTS

| | | |
|---|---|---|
| 2007/0019419 A1 | 1/2007 | Hafuka et al. |
| 2007/0081344 A1 | 4/2007 | Cappaert et al. |
| 2008/0158817 A1* | 7/2008 | Tsunoda et al. ............. 361/697 |

FOREIGN PATENT DOCUMENTS

| | | |
|---|---|---|
| JP | 06-148632 A | 5/1994 |
| JP | 07-335015 A | 12/1995 |
| JP | 10-302540 A | 11/1998 |
| JP | 10-319379 A | 12/1998 |
| JP | 11-202411 A | 7/1999 |
| JP | 2001-265235 A | 9/2001 |
| JP | 2002-296565 A | 10/2002 |
| JP | 2004-138973 A | 5/2004 |
| JP | 2004-333996 A | 11/2004 |
| JP | 2005-084270 A | 3/2005 |
| JP | 2005-265922 A | 9/2005 |
| JP | 2006-106272 A | 4/2006 |
| JP | 2006-310305 A | 11/2006 |
| WO | 2005-064577 A1 | 7/2005 |
| WO | 2006-000948 A2 | 1/2006 |

OTHER PUBLICATIONS

Office Action, Issued Mar. 5, 2012 by the European Patent Office in counterpart European Application No. 09794257.7.

* cited by examiner (B)    (A)

DUST AND DIRT RESISTANT LIQUID CRYSTAL DISPLAY DEVICE

CROSS REFERENCE TO RELATED APPLICATIONS

This application is a National Stage of International Application No. PCT/JP2009/059345 filed May 21, 2009, claiming priority based on Japanese Patent Application No. 2008-179006 filed Jul. 9, 2008 and Japanese Patent Application No. 2008-186177 filed Jul. 17, 2008, the contents of all of which are incorporated herein by reference in their entirety.

TECHNICAL FIELD

The present invention relates to a large-sized liquid crystal display device installed in semi-outdoor public facilities such as station platforms, and more particularly to a cooling means in a closed liquid crystal display device for preventing the penetration of dust and dirt flying in the outside air.

BACKGROUND ART

In recent years, the size and image quality of industrial-use liquid crystal display devices are increasing. The market of digital signage is expanding, the digital signage that displays useful information in diverse public facilities such as displaying services and seat availabilities at stations, airports, etc. or displaying information in shopping arcades, schools, and companies, and demands for large-sized liquid crystal display devices are expanding.

In the background art as described above, for semi-outdoor instillation conditions in station platforms or the like in particular, damage to the surfaces of liquid crystal panels can be considered as likely to occur due to penetration of the liquid crystal panels by dust and dirt that exist in the outside air, water droplets such as rain coming into contact with the liquid crystal panels or due to objects such as empty cans, thrown rocks, etc coming into contact with the liquid crystal panels. Because of this, it is desired to provide more uniform image quality, higher reliability, and longer lifetime for liquid crystal display devices. Further, there are increasing demands for reductions in the volume, profile, weight, and costs of liquid crystal display devices adapted for larger screens.

For these demands, a method is considered in which the surface of a liquid crystal panel is completely and tightly closed using a transparent non-reflective plate such as an acrylic sheet (panel surface protection method).

Furthermore, when the temperature of a liquid crystal panel possibly exceeds the guaranteed operating temperature, a method is also considered in which the temperature is controlled so as to reduce the calorific value by lowering the luminance of fluorescent lamps.

However, when the surface of the liquid crystal panel is completely and tightly closed, it is necessary to provide a clearance (in the following description, an air layer) between the surface of the liquid crystal panel and the transparent non-reflective plate. Because of this, the heat generated from fluorescent lamps in a light source unit, inverter circuit boards, and a control circuit board is transferred to this air layer. At this time, a build up of heat occurs in the air layer because the thermal conductivity of the air layer (the coefficient of thermal conductivity is 0.026 W/mk) is not excellent and the thermal conductivity of the transparent non-reflective plate covering the surface of the liquid crystal panel is not excellent as well. Consequently, temperature rises or temperature variations occur in the liquid crystal panel, which hamper the provision of uniform image quality, high reliability, and longer lifetime.

In addition, because image quality is also reduced in the configuration that lower the luminance, a problem of market appeal arises in accurately displaying and conveying urgent traffic guides, for example.

Accordingly, it is not said that the above-mentioned methods are not adequate for liquid crystal display devices having dust-proof properties, which are installed in semi-outdoor public facilities such as stations.

Then, for example, JP3975506B2 (in the following, abbreviated as Patent Document 1) discloses a liquid crystal display device and a cooling method for the lamp unit of a liquid crystal display device. This technique relates to a device having a cooling mechanism in a backlight accommodating unit. In this device, as shown in FIG. 1(A), accommodating unit 102 that accommodates lamps 101 of the liquid crystal display device has dust-proof properties, in which the air heated by lamps 111 is introduced into cooling mechanism 103 to cool the air and the air is then returned to lamp accommodating unit 102. Consequently, this configuration exerts a certain effect as a configuration that cools tightly closed lamp accommodating unit 102 and that prevents the penetration of outside dust and dirt.

However, according to the cooling technique described in the above-mentioned Patent Document 1, the cooling mechanism itself is disposed inside the lamp accommodating unit in order to spread the heat generated from the lamps. This increases the volume and weight of the lamp accommodating unit. Further, because the fabrication method thereof becomes complicated, costs are increased. Accordingly, this configuration is a disadvantageous for meeting the recent demands for liquid crystal display devices.

Furthermore, as shown in FIG. 1(B), the embodiment for cooling the lamp unit of the liquid crystal display device disclosed in Patent Document 1 is restricted to a scheme in which air blower means 104 and U-shaped ducts 105 that are connected on the outside of lamp accommodating unit 102 are used to cool only the heat generated from fluorescent lamps 101.

In fact, as regards the ration for the quantity of heat that occurs throughout the liquid crystal display device, the quantity of heat from the light source unit is about 60%, and the quantity of heat generated from electronic circuit components such as a power supply unit, personal computer functioning unit, and control unit is about 40%.

Thus, there is a problem in which the cooling means alone for the fluorescent lamp unit disclosed in the Patent Document 1 is not sufficient to meet the cooling capability and high reliability requirements for satisfying the temperature specifications of all the electronic components that have been mounted, from the viewpoint of the overall liquid crystal display device. Further, for improving this cooling capability, there is also a problem in that a tight closing property, which is enough to prevent the penetration of dust and dirt flying in the outside air or water droplets, has to be maintained.

DISCLOSURE OF THE INVENTION

It is an object of the present invention to provide a liquid crystal display device that can solve at least one of the above-described problems of the background art.

It is an object of the present invention to provide a liquid crystal display device that can implement uniform image quality and high reliability as a liquid crystal display device as well as implement reductions in weight and cost through the use of a simple cooling mechanism. Furthermore, while achieving this object, it is an object to provide a liquid crystal display device that can prevent dust and dirt in the outside air from penetrating LCD panels, that can prevent water droplets caused by rain or the like from coming into contact with the LCD panels and that can prevent the LCD panels from damage caused by external impacts.

One aspect of the present invention is a liquid crystal display device including a display unit housing case configured to house a display unit, and an electronic component housing case configured to house an electronic component, and the liquid crystal display device whose structure is tightly closed and that is externally provided with heat radiation fins.

According to the present invention, at least both the tight closing property and cooling performance for the surface of the liquid crystal panel can be satisfied.

DESCRIPTION OF REFERENCE NUMERALS AND SIGNS

Figure 1:
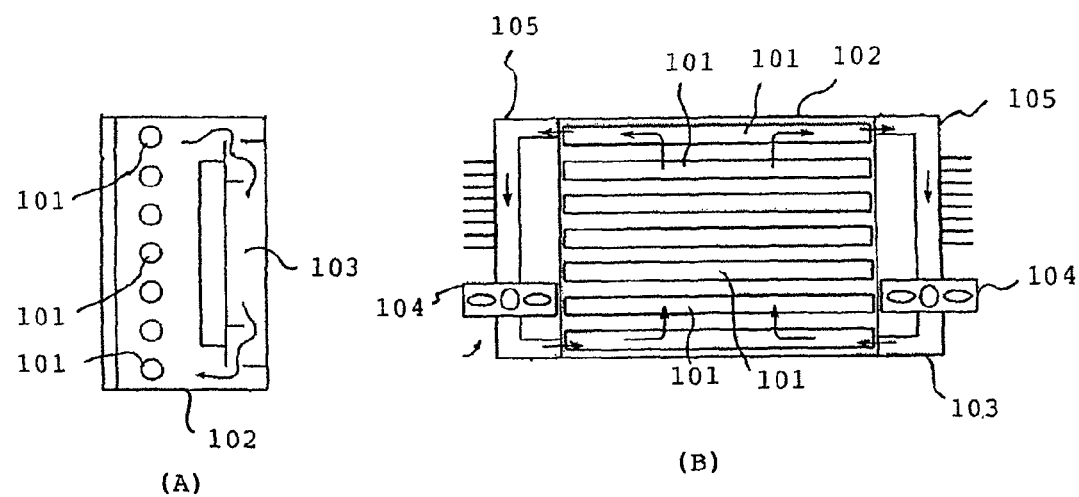
FIG. 1 shows a cross sectional view and a plan view depicting a technique related to the present application.

1 Liquid crystal display device
2 Display unit housing case
3 Electronic component housing case
4 Liquid crystal panel
5 Transparent non-reflective plate
6a, 6b Heat radiation fins
7 Dustproof sheet
8 Top cover
9 Front cover
10 Waterproof sheet
11 Chassis box
12 Bezel frame
13 Electronic component group
14 Screw
17a, 17b Air-cooling fan
18a, 18b Heat exhauster
19 Fluorescent lamp
20 Reflective sheet
21 Graphite sheet
22 Control circuit board
23 Direct ray
24 Reflected light
25a, 25b Fluorescent lamp socket
26a, 26b Inverter circuit board
27a, 27b Inverter circuit board connector
28 Air layer
29 Joint screw
30 Heat transfer direction
31 Cathode unit
32 Thermal connector
33 Heat radiation plate
34 Nut
35 Projections on the inner side surfaces of a chassis box
36 Pin-fin-shaped projections on the inner side surfaces of a chassis box
37 Plate-fin-shaped projections on the inner side surfaces of a chassis box
38 Heat pipe
39 High temperature air in the display unit housing case

BEST MODE FOR CARRYING OUT THE INVENTION

In the following, embodiments of the present invention will be described with reference to the drawings.
Basic Configuration The basic structure of a liquid crystal display device according to the present invention will be described with reference to FIG. 2.

Figure 2:
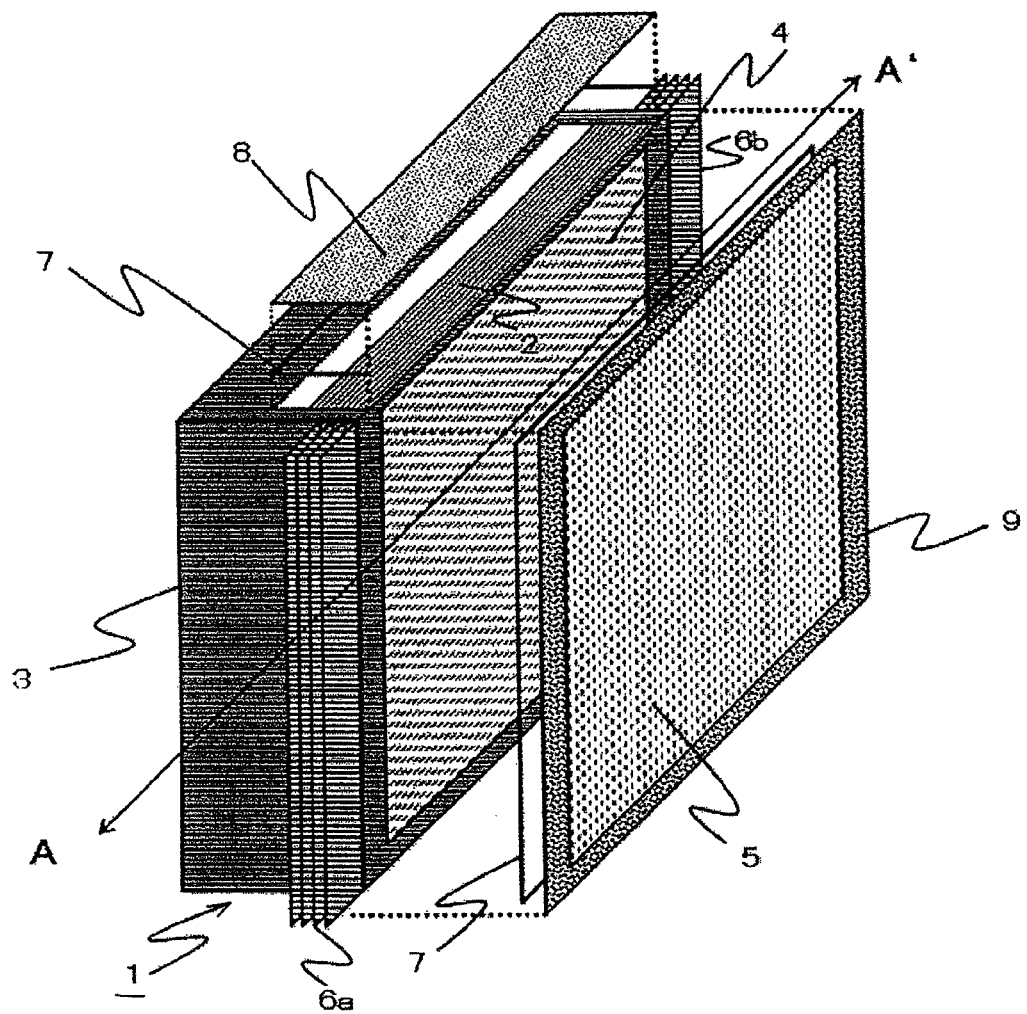
FIG. 2 is a perspective view depicting the basic configurations of a tight closed structure and a cooling structure of a liquid crystal display device according to an exemplary embodiment of the present invention.

For the explanation of the internal structure, FIG. 2 shows transparent non-reflective plate 5, front cover 9 and dustproof sheet 7 that tightly secure the front surface of liquid crystal panel 4, and top cover 8 and dustproof sheet 7 that tightly secure the top side of liquid crystal display device 1, which are opened. However, these two parts are actually completely and tightly closed.

Liquid crystal display device 1 according to this embodiment is formed of display unit housing case 2 located on the front part of the device and electronic component housing case 3 located on the rear part of the device. Display unit housing case 2 is a case that houses a display unit such as liquid crystal panel 4 for displaying images or the like as well as a light source unit such as fluorescent lamps 19. Electronic component housing case 3 is a case mounted with electronic component group 13 including a power supply circuit board, control circuit board, and audio circuit board for performing power supplying and driving or controlling of electronic components.

Liquid crystal display device 1 as described above has such a cooling structure that the heat generated from the light source unit inside display unit housing case 2 is dissipated from heat radiation fins 6 mounted on the right and left sides of display unit housing case 2 for reducing the temperature of liquid crystal panel 4.

Furthermore, device 1 is configured such that the heat generated from electronic component group 13 mounted inside electronic component housing case 3 is uniformly spread inside case 3 by stirring the air with fans and dissipated into the air around device 1 with heat exhausters disposed on the rear side of case 3.

Tight Closing Means

The structure of display unit housing case 2 mentioned above will be described with reference to FIG. 3.

Figure 3:
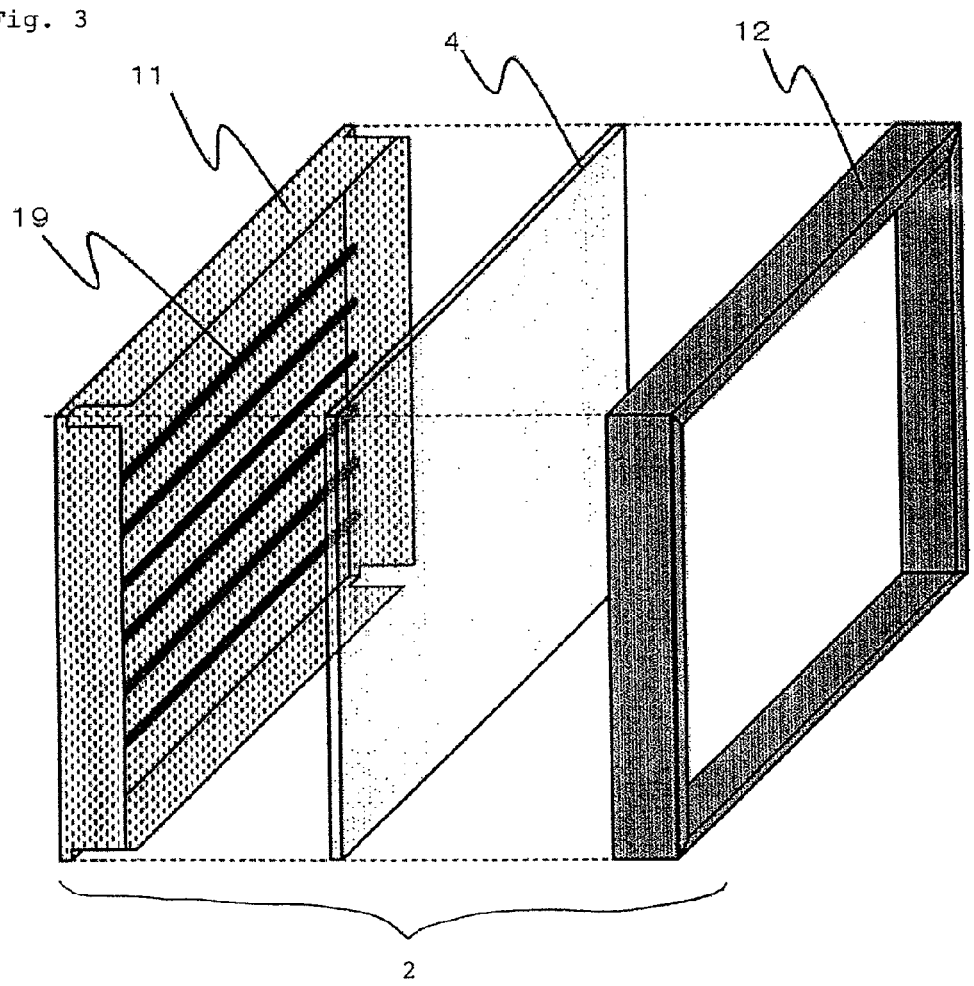
FIG. 3 is an exploded diagram depicting a display unit housing case according to an exemplary embodiment of the present invention.

FIG. 3 shows case 2 as exploded for detailed descriptions of the internal structure.

Display unit housing case 2 has chassis box 11 made of a copper or aluminum material for housing fluorescent lamps 19, a reflector, described later, liquid crystal panel 4, etc.

For fluorescent lamps 19, a small fluorescent tube having a small diameter is used, which is called a cold-cathode tube (Cold Cathode Fluorescent Lamp). Chassis box 11 is formed in a coverless, oblong box shape, four sides of which are bent inward with slits each on four corners.

Furthermore, oblong, hollow bezel frame 12 formed of an aluminum material or the like is placed over chassis box 11, and four flat side portions laid on each other are joined with screws. Consequently, the adjacent side portions become tightly closed.

Next, the configuration and the specifications of appearance concerning display unit housing case 2 after assembly will be described with reference to FIG. 4.

Figure 4:
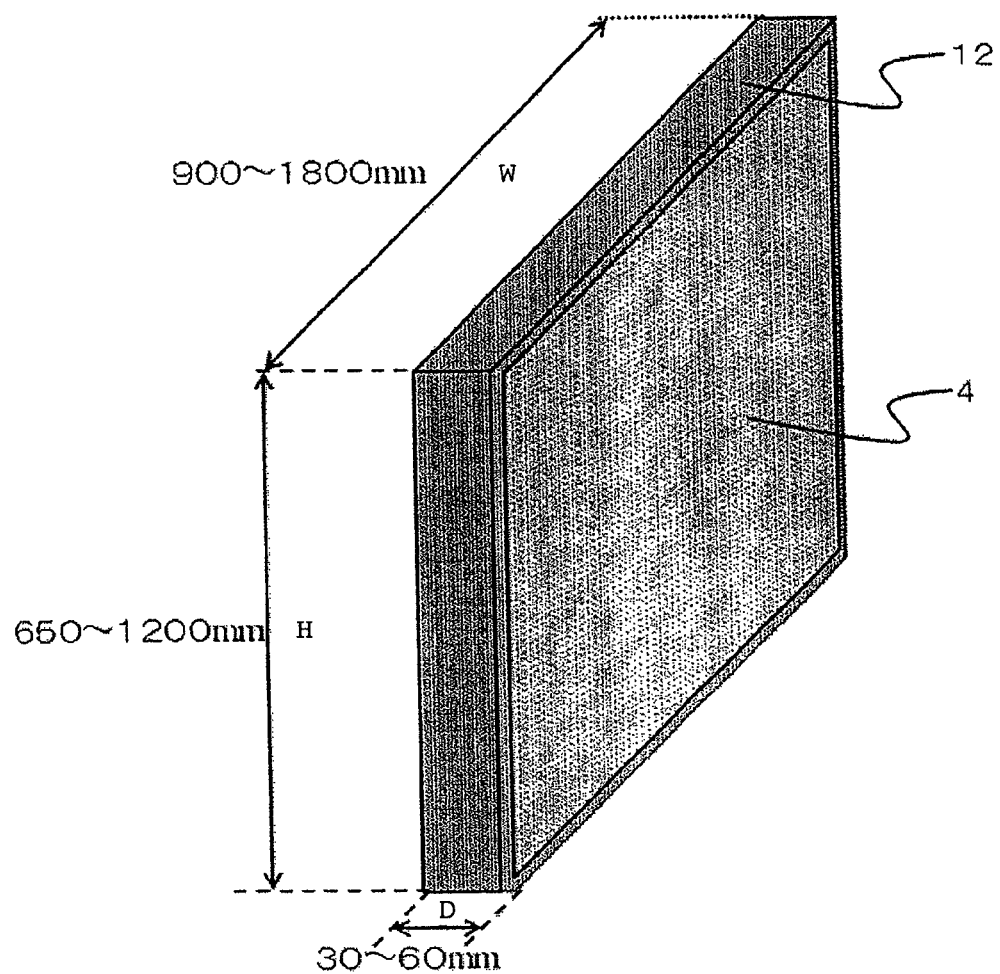
FIG. 4 is an assembly diagram depicting the display unit housing case according to an exemplary embodiment of the present invention.

As shown in FIG. 4, display unit housing case 2 is configured in which liquid crystal panel 4 on the front side is tightly closed with bezel frame 12. For this bezel frame 12, an aluminum material having a plate thickness of 1.5 mm is used in order to prevent distortion or deformation of the front surface of liquid crystal panel 4, and uneven dimples are applied on the surface thereof to definitely provide strength.

In addition, for the sizes of bezel frame 12 and liquid crystal panel 4, the size of 30 to 65 inches is assumed for public displays that are used in public facilities. For example, the breath (W) ranges from 900 to 1800 mm, the depth (D) 30 to 60 mm, and the height (H) 650 to 1200 mm.

Figure 5:
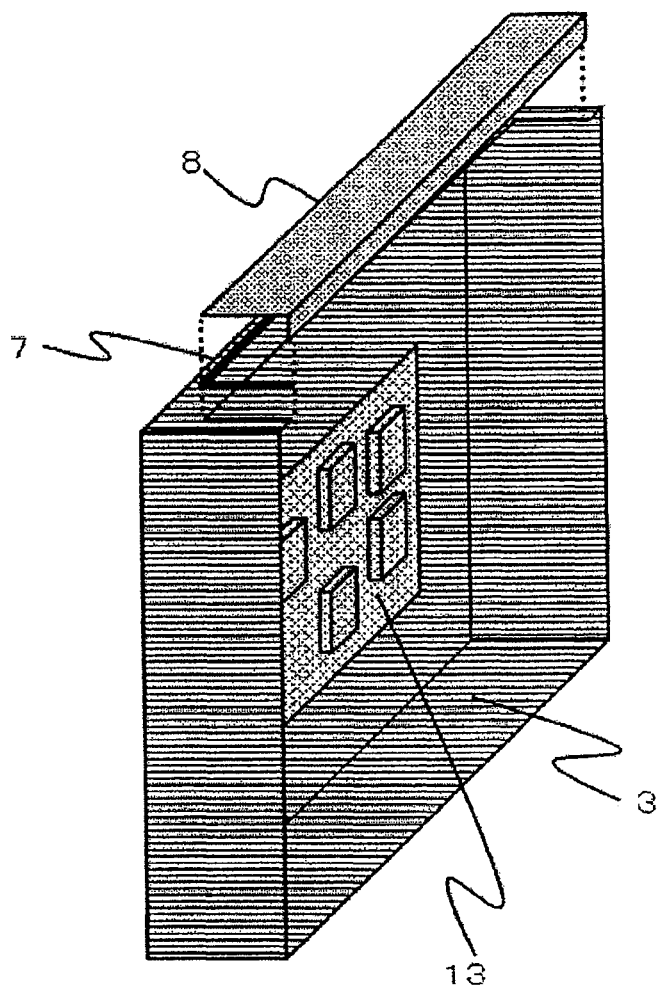
FIG. 5 is an exploded diagram depicting an electronic component housing case according to an exemplary embodiment of the present invention.

Next, the internal configuration of electronic component housing case 3 will be described more in detail with reference to FIG. 5.

Electronic component housing case 3 is formed in an oblong box shape in which an aluminum metal plate having a plate thickness of 1 to 1.5 mm is formed all in one piece by bending, welding, or the like.

The aluminum metal plate is applied with a black coating to both the inner and outer surfaces of electronic component housing case 3 in order to obtain the promotion effect of radiant heat transfer.

Electronic component group 13 is mounted inside case 3. Further, not shown in the drawing, the heat radiation fins are fixed to the right and left sides of electronic component housing case 3.

An opening (notch) that is tightly closed by cover 8 is formed in the top side of electronic component housing case 3. This opening is provided in order to avoid the interference between two cases when display unit housing case 2 is assembled inside electronic component housing case 3.

Then, after display unit housing case 2 is assembled inside electronic component housing case 3, the opening is tightly closed by top cover 8 through dustproof sheet 7.

Figure 6:
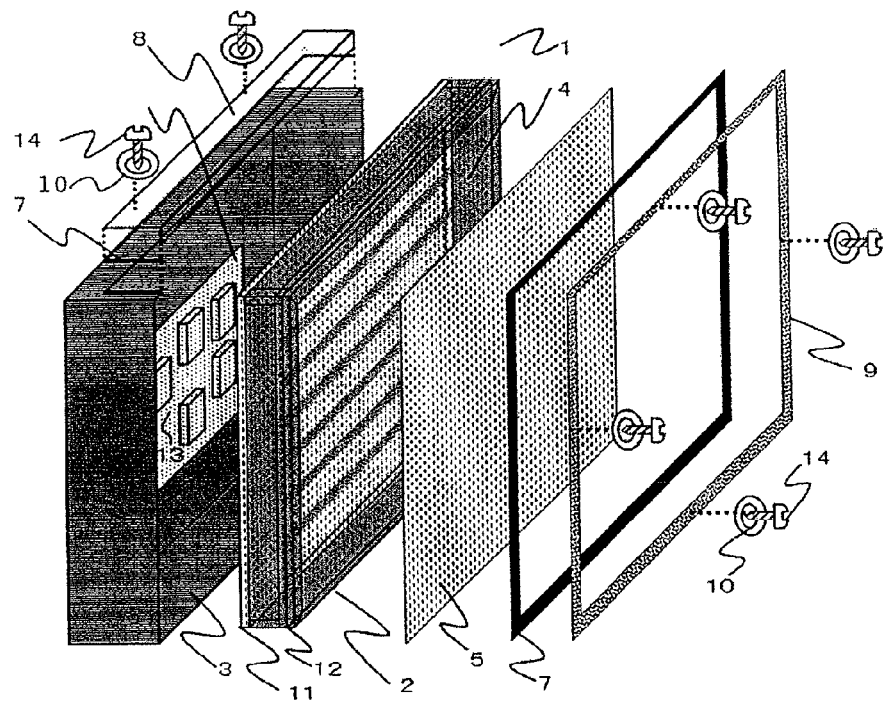
FIG. 6 is an exploded diagram illustrative of the tight closed structure and the cooling structure of the liquid crystal display device according to an exemplary embodiment of the present invention.

Next, the tight closed structure of the display unit housing case and the electronic component housing case that forms the liquid crystal display device according to the present invention 1 will be described in detail with reference to FIG. 6.

Closed display unit housing case 2 is assembled in the front opening of electronic component housing case 3 with top cover 8 removed. Next, the opening in the top side of electronic component housing case 3 is tightly closed by top cover 8 through dustproof sheet 7, and screws 14 together with waterproof sheets 10 are used to fix top cover 8 to electronic component housing case 3.

Furthermore, transparent non-reflective plate 5 is disposed on the front surface of liquid crystal panel 4 on the front side of bezel frame 12, dustproof sheet 7 is disposed on the outer circumferential portion of transparent non-reflective plate 5 provided on the flat part on the front side of bezel frame 12, and then the outer circumferential portion is fixed using front cover 9 and screws 14 with waterproof sheets 10. Consequently, the front surface of liquid crystal panel 4 and transparent non-reflective plate 5 become completely and tightly closed.

As described above, it is made possible to completely and tightly close liquid crystal display device 1 that is formed of display unit housing case 2 and electronic component housing case 3.

Cooling Means

Next, the cooling structure of liquid crystal display device 1 having the above-mentioned tight closed structure will be described in detail with reference to FIG. 7.

Figure 7:
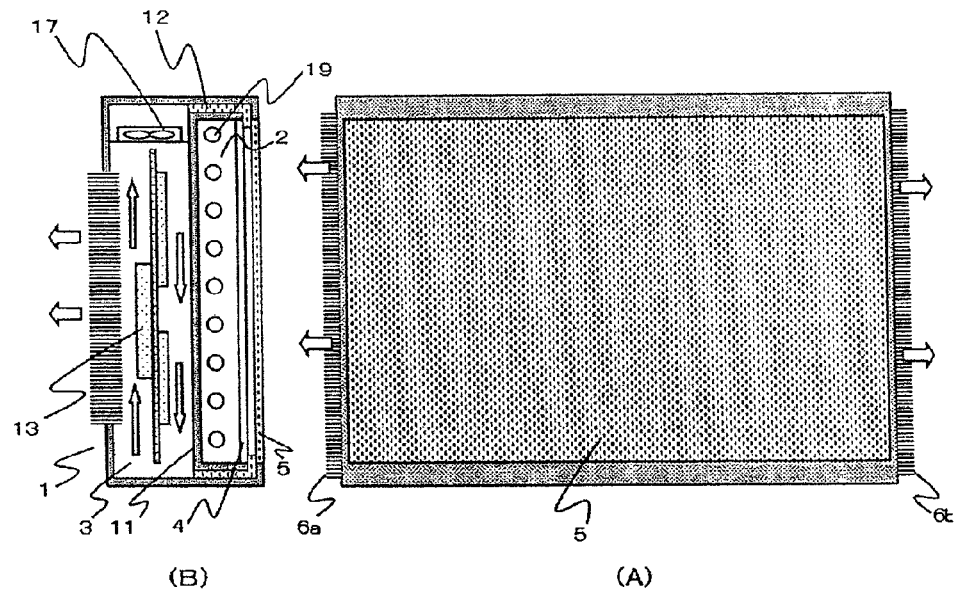
FIG. 7 shows a vertical cross sectional view and a front view depicting the cooling structure of the liquid crystal display device according to an exemplary embodiment of the present invention.

FIG. 7 shows the basic cooling structure of the liquid crystal display device according to the present invention; (A) is a front view depicting the front side of the liquid crystal display device, and (B) is a vertical cross sectional view depicting the liquid crystal display device.

In the liquid crystal display device 1 according to the present invention, a heat dissipation path is divided into two as shown below.

First, because display rays as well as heat are emitted from fluorescent lamps 19 assembled inside display unit housing case 2 to the liquid crystal panel 4 side, a novel heat dissipation path is formed such that the heat can be dissipated from the right and left sides of liquid crystal display device 1 by natural air cooling.

Secondly, such a novel heat dissipation path is formed such that the heat generated from electronic component group 13, the components of which are interspersed inside electronic component housing case 3, is dissipated using a heat exhausting means by guiding the air inside electronic component housing case 3.

In the following, the above-mentioned cooling configuration will be described in more detail.

The first heat generated from fluorescent lamps 19 exceeds the guaranteed temperature of 60° C. for the temperature of liquid crystal panel 4 if left as is because the surface of liquid crystal panel 4 become completely and tightly closed by transparent non-reflective plate 5.

Then, in the present invention, heat radiation fins 6a and 6b are disposed on the right and left sides of liquid crystal display device 1.

This increases the amount of heat radiated from each of heat radiation fins 6a and 6b into the air around the liquid crystal display device, and the amount of heat radiated toward the liquid crystal panel 4 side is reduced correspondingly. Because of this, it is made possible to tightly secure the surface of liquid crystal panel 4 with transparent non-reflective plate 5.

Subsequently, the second heat generated from electronic component group 13, the components of which are interspersed inside electronic component housing case 3, is uniformly spread inside case 3 by air-cooling fan 17 that stirs the air inside device 1. Then, the spread heat is dissipated into the air around device 1 by the heat exhausters formed in one piece with a rear cover on the rear surface side of electronic component housing case 3. Consequently, it is made possible to cool tightly closed electronic component housing case 3.

Next, the cooling structure of the liquid crystal display device according to the present invention will be described in detail with reference to FIG. 8.

Transparent non-reflective plate 5 formed of an acrylic sheet or the like is disposed over the front surface of liquid crystal panel 4 through clearance (air layer) 28 having a thickness of about 5 mm so as not to come into contact with the surface of liquid crystal panel 4, and transparent non-reflective plate 5 is brought into intimate contact with bezel frame 12 made of aluminum or the like through dustproof sheet 7. Bezel frame 12, with which transparent non-reflective plate 15 is in close contact, is placed and laid over chassis box 11 formed of an aluminum material or the like in an oblong box shape for housing liquid crystal panel 4 or the like. Then, graphite sheet 21 having a thermal conductivity coefficient of 500 W/mk in the in-plane direction and anisotropy with a thermal conductivity coefficient of 5 W/mk in the thickness direction is provided on the rear side of reflective sheet 20 that reflects the rays of fluorescent lamps 19. Thus, it is made possible to transfer heat to the side surface sides of bezel frame 12.

As described above, in the present invention, the heat inside display unit housing case 2 is spread so as to let the heat generated from fluorescent lamps 19 go toward the side surface sides of bezel frame 12 in order to make the temperature inside case 2 uniform.

In addition, for chassis box 11, a highly rigid aluminum material or the like is used in order to prevent liquid crystal panel 4 from being distorted and deformed in order to definitely provide stable image quality, high reliability, and longer lifetime.

Furthermore, on the rear surface side of chassis box 11, inverter circuit boards 26a and 26b for lighting fluorescent lamps 19 and control circuit board 22 are mounted.

Further, the rays of a plurality of fluorescent lamps 19 inside display unit housing case 2 sometimes enter liquid crystal panel 4 as direct light 23. Furthermore, the rays are sometimes turned into reflected light 24 and enter liquid crystal panel 4 by plastic reflective sheet 20 formed of a PET foam or the like having a thickness of about 1 mm, for example, plastic reflective sheet 20 being disposed behind fluorescent lamp 5. The display rays, in these two cases, display images or the like. About 70% of the display rays is converted into heat.

In the present invention, such a configuration is formed in which a part of about 70% of the quantity of heat of the display rays is dissipated into three heat dissipation paths below to reduce the quantity of heat going toward liquid crystal panel 4.

In the first heat dissipation path, a part of the quantity of heat generated from inverter circuit boards 26a and 26b mounted on the rear side of chassis box 11 is transferred to chassis box 11 through inverter circuit board connectors 27a and 27b. Next, the heat is dissipated from heat radiation fins 6a and 6b mounted on the right and left sides of electronic component housing case 3 through bezel frame 12 formed in one piece with chassis box 11 by natural convection in the air around device 1.

In the second heat dissipation path, a part of the quantity of heat generated from control circuit board 22 is directly transferred to chassis box 11. Then, the heat is transferred to heat radiation fins 6a and 6b mounted on the right and left sides of electronic component housing case 3 through bezel frame 12, and the heat is dissipated from here by natural convection in the ambient air.

In the third heat dissipation path, a part of the quantity of heat generated from fluorescent lamps 19 is transferred to chassis box 11 through fluorescent lamp sockets 25a and 25b. Then, the heat is dissipated from heat radiation fins 6a and 6b mounted on the right and left sides of electronic component housing case 3 through bezel frame 12 by natural convection in the air around device 1. In addition, fluorescent lamp sockets 25a and 25b are formed of insulators with high thermal conductivity made of a composite material of a resin and filler.

Further, the heat generated from electronic component group 13, inverter circuit boards 26a and 26b, control circuit board 22, or the like occupies about 40% of the calorific value of the overall liquid crystal display device. As discussed above, the cooling structure for this heat has heat exhausters 18a and 18b formed in one piece on the rear side of the device with air-cooling fans 17a and 17b inside the closed device.

In this configuration, air-cooling fans 17a and 17b are provided for guiding the heat of electronic component group 13, the components of which are interspersed, to the rear surface side of the device by stirring the air such that the flow rate of the air above electronic component group 13 is increased. As shown in FIG. 7(B), air-cooling fans 17a and 17b guide the high temperature air inside electronic component housing case 3 toward the lower side of device 1 and deliver the air into heat exhausters 18a and 18b disposed on the right and left of the rear side of device 1 at high speed for obtaining effective heat exhaust.

Consequently, an effect can be obtained such that the temperature specifications required for electronic component group 13 are satisfied by heat transfer inside device 1, using radiant heat transfer promotion which uses a black coating on the aluminum metal plate forming electronic component housing case 3, and by natural convection flowing in the air around device 1.

The cooling structure of display unit housing case 2 will be described in detail with reference to FIG. 9. In addition, FIG. 9 depicts enlarged area B shown in FIG. 8.

In the present invention, inverter circuit board connector 27a is mounted on chassis box 11. Then, the right and left sides of chassis box 11 and the right and left sides of bezel frame 12 placed and laid over chassis box 11 are joined together to the right and left sides on the front part of electronic component housing case 3, which are formed in one piece along with heat radiation fin 6a using joint screws 29.

With this configuration, a part of the heat generated from a plurality of fluorescent lamps 19 is first transferred to fluorescent lamp socket 25a. Then, the heat is transferred to the bottom of chassis box 11 formed of an aluminum material or the like with fluorescent lamp socket 25a mounted thereon. After that, the heat can be dissipated from the right and left side walls of bezel frame 12 formed in one piece with chassis box 11, the side walls of aluminum plates on the front side forming electronic component housing case 3, and heat radiation fin 6a using natural convection in the air around device 11. See heat transfer directions 30 in FIG. 9.

In addition, joint screws 29 are made of a metal material such as aluminum, iron, copper, or brass. Thus, such an effect that serves as effective thermal conduction paths can be obtained, which communicate through the right and left side walls of chassis box 11, the right and left side walls of bezel frame 12, and the side walls formed of the right and left aluminum plates on the front part of electronic component housing case 3.

Further, a part of the heat generated from inverter circuit board 26a and control circuit board 22 mounted on the rear side of chassis box 11 is transferred to the right and left side walls of chassis box 11 and bezel frame 12, and the side walls formed of the right and left aluminum plates on the front part of electronic component housing case 3.

After that, heat radiation fins 6a and 6b mounted on the right and left sides of display unit housing case 2 allow efficient heat dissipation using natural convection in the air around device 1.

With the configurations described above, because the heat generated from fluorescent lamps 19, inverter circuit board 26a, and control circuit board 22 is transferred to the above-mentioned heat dissipation paths to reduce the quantity of heat toward the surface of liquid crystal panel 4, it is made possible to tightly secure the front surface of liquid crystal panel 4 with transparent non-reflective plate 5.

Next, the effects obtained from the cooling structure of the liquid crystal display device according to the present invention will be described.

After the display unit housing case is assembled into the oblong, box-shaped electronic component housing case is formed of an aluminum material or the like with a black coating applied on the inner and outer surfaces thereof for promoting radiant heat transfer, the electronic component housing case being formed in one piece except the opening in the top side of the case, the opening in the top side can be tightly secured through the dustproof sheet.

Furthermore, with the configuration in which the surface of the liquid crystal panel assembled into the display unit housing case is tightly closed by the transparent non-reflective plate through the dustproof sheet, such effects that satisfy dust-proof properties and waterproof properties required for liquid crystal display devices installed on station platforms can be obtained.

Furthermore, it was suggested that possible higher luminance be made by forming heat radiation fins 6a and 6b mounted on the right and left sides of the display unit housing case based on the following specifications.

1) According to the embodiment, taking into consideration increased device size, the above-mentioned heat radiation fins have the fin specifications with the smallest thermal resistance in order to effectively utilize natural convection in the ambient air. According to the embodiment, for the liquid crystal display device having a device height of 850 mm and a device depth of 150 mm in size, the specifications of the side bell fins mounted on the right and left sides of the display unit housing case were set as follows: the fin clearance was 13 mm; the number of fins was six; the fin thickness was 1.5 mm; the fin height was 30 mm; the fin length was 800 mm; the fin width was 74 mm; and the fin base thickness was 4 mm. In this case, it was confirmed that the desired temperature specifications were satisfied as the surface of the liquid crystal panel was tightly closed by the transparent non-reflective plate.

2) For the specifications of the above-mentioned heat radiation fins in 1), the following was set since the number of fins and the fin width were changed. The fin clearance was 13 mm, the number of fins was ten, the fin thickness was 1.5 mm, the fin height was 30 mm, the fin length was 800 mm, the fin width was 132 mm, and the fin base thickness was 4 mm. In this case, the effect of a temperature drop of about 2° C. is confirmed for the temperature of the liquid crystal panel as compared with the above-mentioned specifications in 1), since the surface of the liquid crystal panel is tightly closed by the transparent non-reflective plate.

Second Embodiment

A second embodiment of the present invention will be described with reference to FIG. 10. In addition, FIG. 10 shows enlarged area B shown in FIG. 8.

Figure 8:
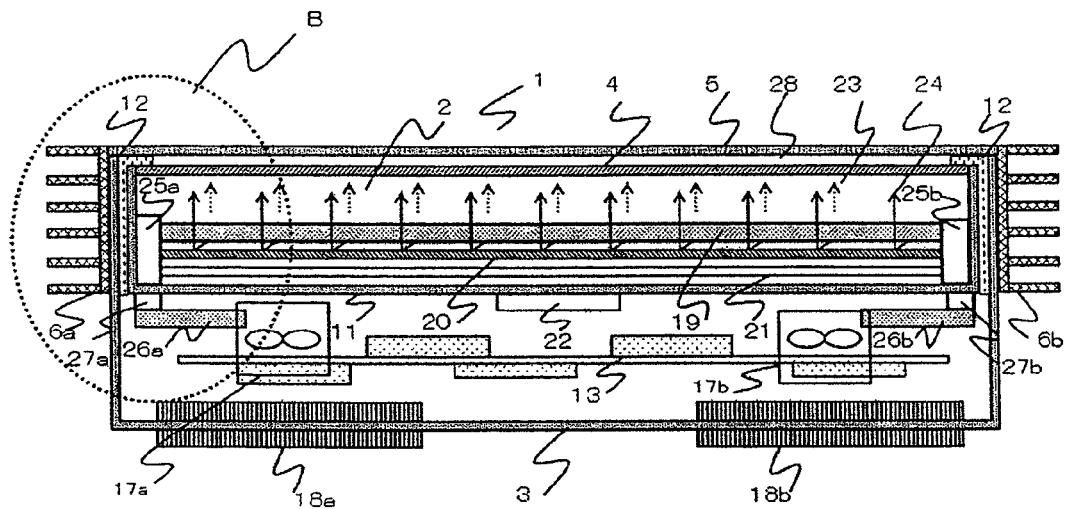
FIG. 8 is a diagram depicting the cross section along line A-A' shown in FIG. 2.
Figure 9:
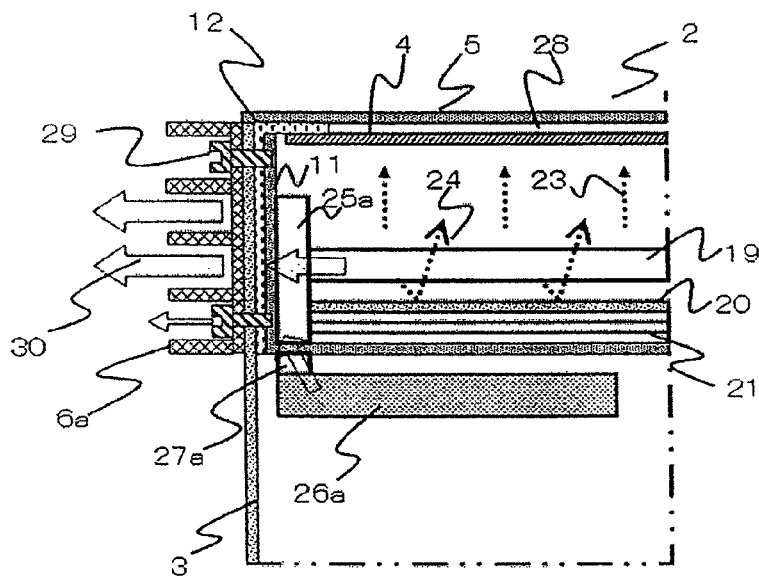
FIG. 9 is an enlarged cross sectional view depicting area B shown in FIG. 8.

The configuration of this embodiment is almost the same as the above-mentioned configuration in FIG. 8. However, only one large difference is in that the side surface of fluorescent lamp socket 25a does not come into with the side surface of chassis box 11. More specifically, there is an air layer between the side surface of fluorescent lamp socket 25a and the side surface of chassis box 11.

Figure 10:
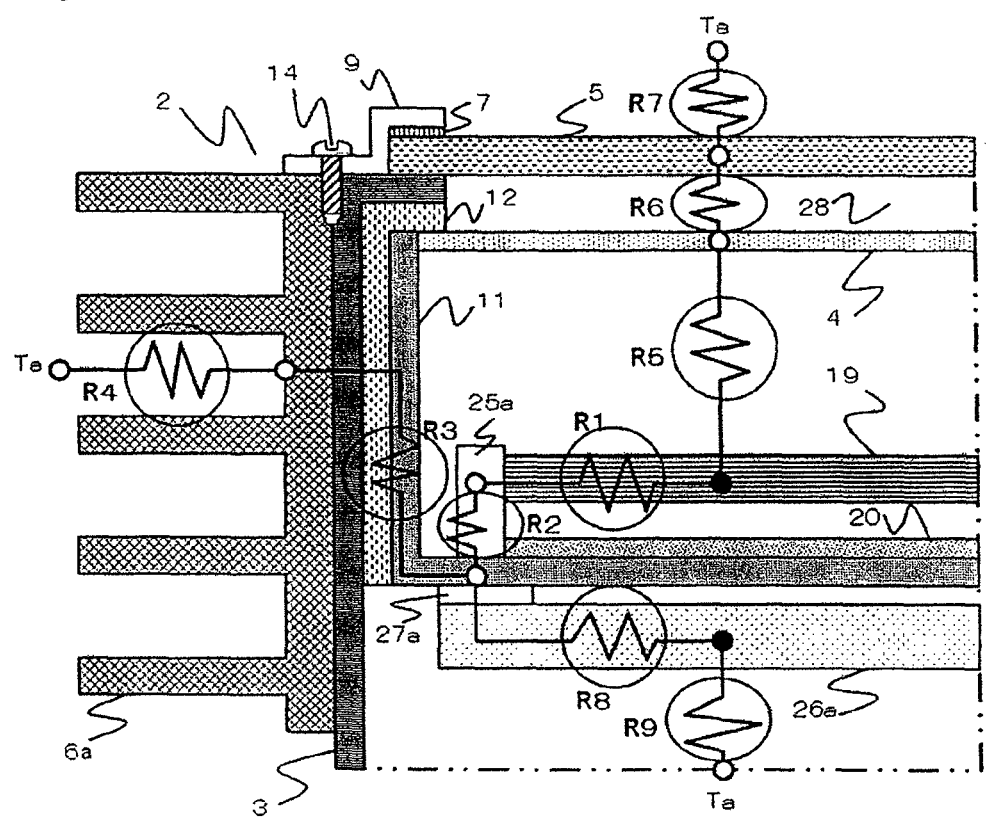
FIG. 10 is a diagram depicting a thermal network in a display unit housing case according to a second exemplary embodiment of the present invention.

In this configuration, in FIG. 10, heat dissipation paths for fluorescent lamp 19 as a heat source, and for inverter circuit board 26a as a heat source, are expressed by a thermal network.

First, the heat generated from a plurality of fluorescent lamps 19 including other fluorescent lamps 19, not shown, is dissipated into the air around device 1 from three heat dissipation paths 1) to 3) below.

1) A heat dissipation path to the sides of the display unit housing case:

The heat from fluorescent lamps 19 is transferred to fluorescent lamp sockets 25a, which are mounting units for fluorescent lamps 19, and then to the top side of chassis box 11, on which fluorescent lamp sockets 25a are mounted. Furthermore, the heat is transferred to the right and left side walls of bezel frame 12 formed in one piece with the right and left side walls of chassis box 11, the aluminum metal plates forming the right and left side walls on the front part of electronic component housing case 3, and heat radiation fin 6a. Then, the heat is dissipated from heat radiation fin 6a using natural convection in the air around device 1.

In addition, not shown in the drawing, a current carrying unit is provided inside fluorescent lamp socket 25a, and is connected to inverter circuit board 26a.

In this configuration, the thermal resistance between fluorescent lamps 19 and fluorescent lamp sockets 25a can be expressed by R1. Further, the thermal resistance between fluorescent lamp sockets 25a and chassis box 11 can be expressed by R2, the thermal resistance between chassis box 11 and heat radiation fin 6a by R3, and the thermal resistance between heat radiation fin 6a and air (Ta) around device 1 by R4.

2) A heat dissipation path to the front side of the display unit housing case

There are two cases in which heat is absorbed as direct light into the surface of liquid crystal panel 4 disposed on the front side of fluorescent lamps 19, and in which heat is absorbed as reflected light from reflective sheet 20 into the surface of liquid crystal panel 4. The heat from fluorescent lamps 19 is transferred according to these two cases, and further transferred from liquid crystal panel 4 to transparent non-reflective plate 5 that protects and tightly closes this liquid crystal panel 4. Then, the heat is dissipated from transparent non-reflective plate 5 into the air around device 1 using natural convection.

In this configuration, the thermal resistance between fluorescent lamps 19 and liquid crystal panel 4 can be expressed by R5. Further, the thermal resistance between liquid crystal panel 4 and transparent non-reflective plate 5 can be expressed by R6, and the thermal resistance between transparent non-reflective plate 5 and air (Ta) around device 1 by R7.

In addition, in this liquid crystal display device, reflective sheet 20 (made of plastic such as a PET foam or the like having a thickness of about 1 mm) disposed behind fluorescent lamps 19 has low thermal conductivity, and a graphite sheet, not shown, also has low thermal conductivity in the thickness direction. Because of this, the quantity of heat traveling from fluorescent lamps 19 to the liquid crystal panel 4 side is the highest among the entire heat dissipation paths.

3) A heat dissipation path to the rear side of the display unit housing case

Inverter circuit board 26a is mounted inside electronic component housing case 3. In the present invention, the heat generated from inverter circuit board 26a is guided by air-cooling fan 17 mounted inside electronic component housing case 3 to the rear surface side of device 1 through air stirring, and dissipated through the heat exhausters formed in one piece with the rear cover of device 1.

In this configuration, the thermal resistance between inverter circuit board 26a and chassis box 11 can be expressed by R8, and the thermal resistance between inverter circuit board 26a and electronic component housing case 3 by R9.

In the above-mentioned heat dissipation path from fluorescent lamps 19 toward the front surface of liquid crystal panel 4, there is a concern that thermal resistances R6 and R7 mentioned above can increase because of the low thermal conductivity of air layer 28 and transparent non-reflective plate 5 formed of an acrylic sheet.

Then, thermal resistance R1 between fluorescent lamps 19 and fluorescent lamp socket 25a, thermal resistance R2 between fluorescent lamp socket 25a and chassis box 11, and thermal resistance R3 between chassis box 11 and heat radiation fin 6a are made as small as possible. With this configuration, it is made possible to implement a completely and tightly closed liquid crystal display device since a part of the heat quantity from fluorescent lamps 19 toward the front surface of liquid crystal panel 4 can be released through new thermal conduction paths toward the sides of liquid crystal display device 1.

In addition, for the front surface structure of typical liquid crystal television sets or the like, the surfaces of the liquid crystal panels are opened and receive no influence from thermal resistance R6, and thus it is unnecessary to use the side surface parts of device 1 for the cooling structure.

Figure 11:
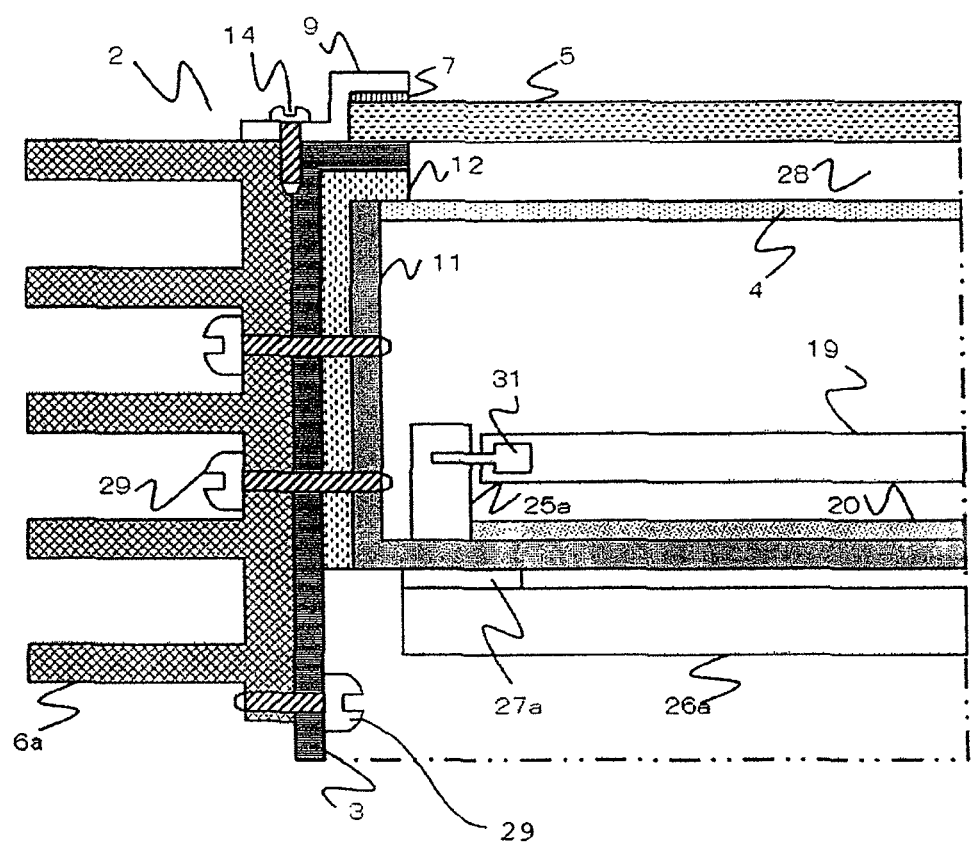
FIG. 11 is a diagram depicting a joining structure on the right and left sides of a liquid crystal display device according to the second exemplary embodiment of the present invention.

Next, the configuration for reducing thermal resistance R3 mentioned above will be described with reference to FIG. 11.

The right and left side walls of chassis box 11, the right and left side walls of bezel frame 12, the aluminum metal plates forming the right and left side walls of the front part of electronic component housing case 3, and heat radiation fin 6a are joined to each other with joint screws 29. At this time, joint screws 29 install heat radiation fin 6a from the outside of electronic component housing case 3. Furthermore, same joint screw 29 is used to install heat radiation fin 6a from the inside of electronic component housing case 3.

With this configuration, it is made possible to fix heat radiation fin 6a to electronic component housing case 3 in advance, electronic component housing case 3 is subsequently assembled over bezel frame 12 formed in one piece with chassis box 11, and then heat radiation fin 6a is fixed from the outside of electronic component housing case 3. Consequently, ease of assembly is increased.

Further, the contact thermal resistance between heat radiation fin 6a and the side of device 1 is made smaller by fixing heat radiation fin 6a from the inside and outside of device 1 with joint screws 29. As the result, the thermal resistance of thermal resistance R3 can be made smaller and the effect of heat dissipation can be also enhanced.

When the heat radiation fins are fixed with joint screws 29, preferably, they are joined to each other through waterproof seal 10 made of rubber or silicon, for example.

Next, the configuration for reducing thermal resistances R1 and R2 mentioned above will be described with reference to FIG. 12.

In this embodiment, chassis box 11 is connected with fluorescent lamp socket 25a and thermal connector 32 that is disposed inside this fluorescent lamp socket 25a and made of a metal material such as aluminum or copper, thermal connector 32 being isolated from cathode unit 31 (lamp current carrying unit).

As described above, thermal connector 32, which is made of a metal material such as an aluminum plate or copper plate and which is connected to chassis box 11, is disposed inside fluorescent lamp socket 25a. Thus, thermal resistance R1 described above can be made smaller since the dummy thermal conductivity coefficient of fluorescent lamp socket 25a is increased. Furthermore, thermal connector 32 made of an aluminum plate, copper plate, or the like is connected to the bottom part of chassis box 11, and thus thermal resistance R2 described above is made smaller and the heat dissipation effect of device 1 is also enhanced.

Next, the configuration for further reducing thermal resistances R2 and R3 in the configuration in FIG. 12 will be described with reference to FIG. 13.

Chassis box 11 is connected with fluorescent lamp socket 25a, thermal connector 32 disposed inside fluorescent lamp socket 25a, and heat radiation plate 33 that covers the outer frame of fluorescent lamp socket 25a, and is isolated from cathode unit 31. Furthermore, heat radiation plate 33 extends along the inner side surface of chassis box 11. This extending portion of heat radiation plate 33 is fixed to the inner side surface of chassis box 11 with joint screws 29 and nuts 34.

Figure 12:
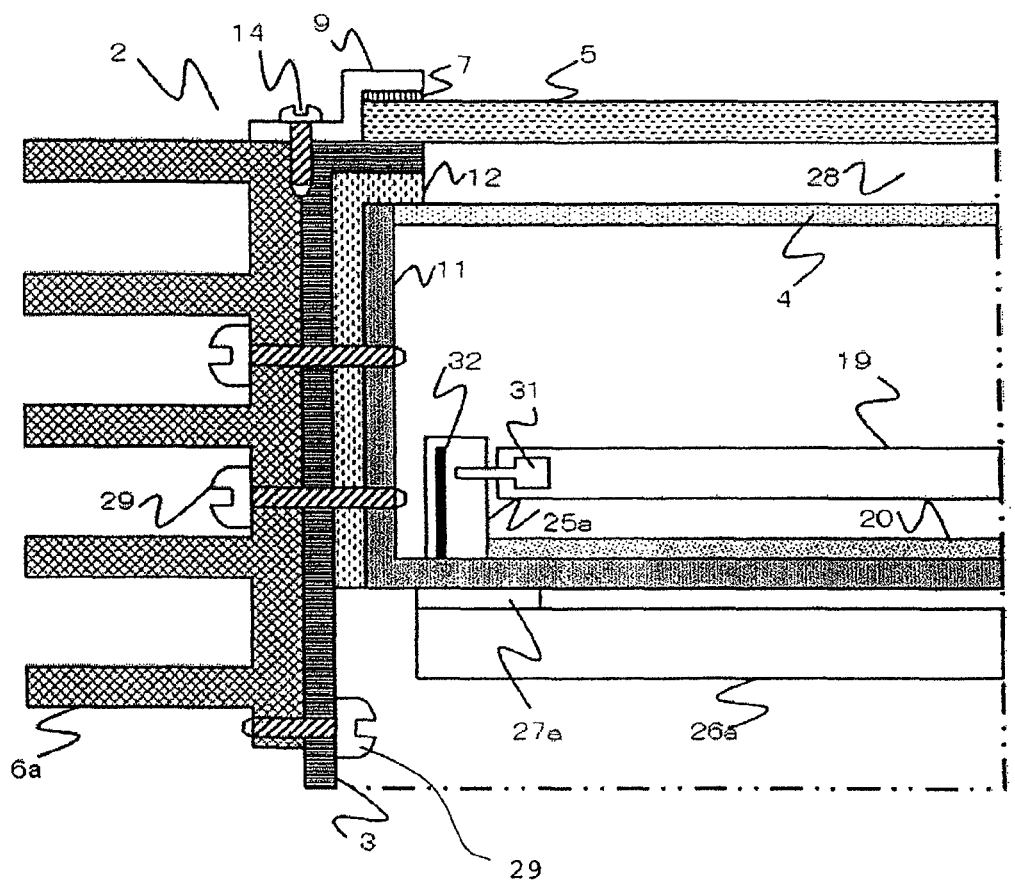
FIG. 12 is a diagram depicting a thermal connector structure built in the fluorescent lamp socket of a liquid crystal display device according to the second exemplary embodiment of the present invention.

With this configuration, as compared with the above-mentioned configuration in FIG. 12, the dummy thermal conductivity coefficient of fluorescent lamp socket 25a is further made greater. Consequently, the amounts of thermal resistances R1 and R2 are further reduced, and the heat dissipation effect of device 1 is further enhanced.

Next, the configuration for further reducing thermal resistance R3 in the configuration shown in FIG. 13 will be described with reference to FIG. 14.

Figure 13:
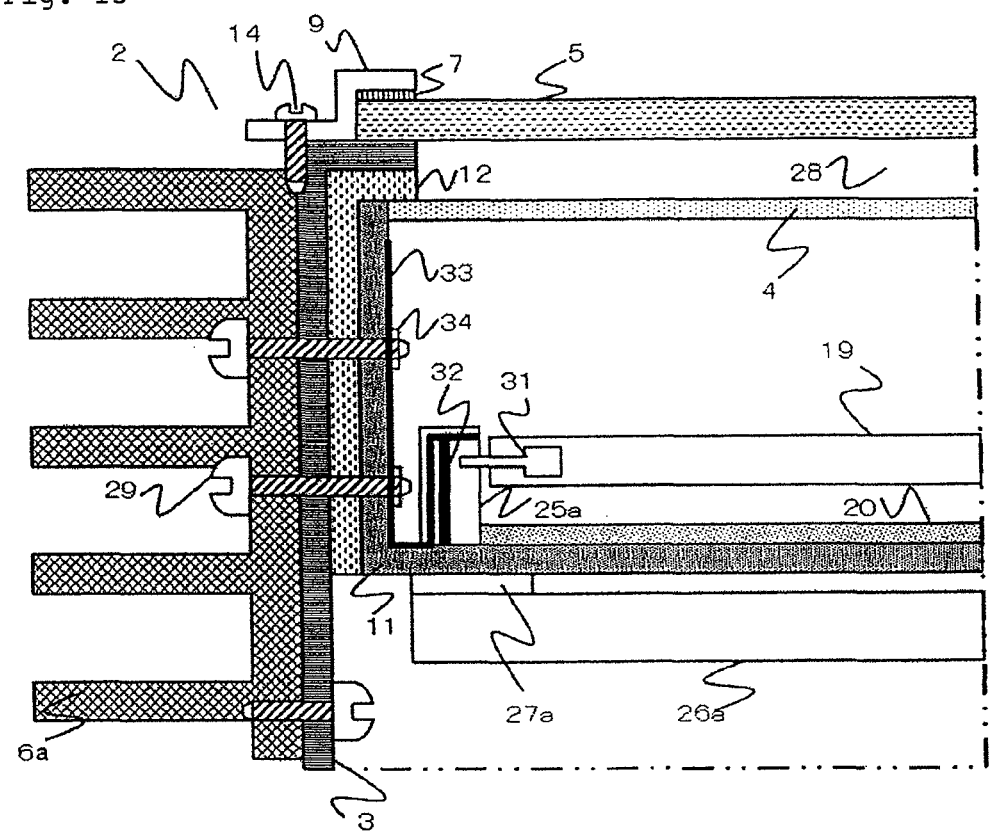
FIG. 13 is a diagram depicting a heat transfer plate structure built in the fluorescent lamp socket of the liquid crystal display device according to the second exemplary embodiment of the present invention.

For the above-mentioned configuration shown in FIG. 13, projections 35 are further formed on the inner side surfaces of the right and left side walls of chassis box 11. Projections 35 are made of a metal material such as copper or aluminum.

With these projections 35, the contact area between high temperature air 39 inside display unit housing case 3 and the inner side surface of chassis box 11 grows to increase the quantity of heat traveling along the side surfaces of device 1 inside display unit housing case 3. Consequently, as compared with the above-mentioned configuration shown in FIG. 13, the amount of thermal resistance R3 is further reduced, and the heat dissipation effect of device 1 is further enhanced.

Figure 15:
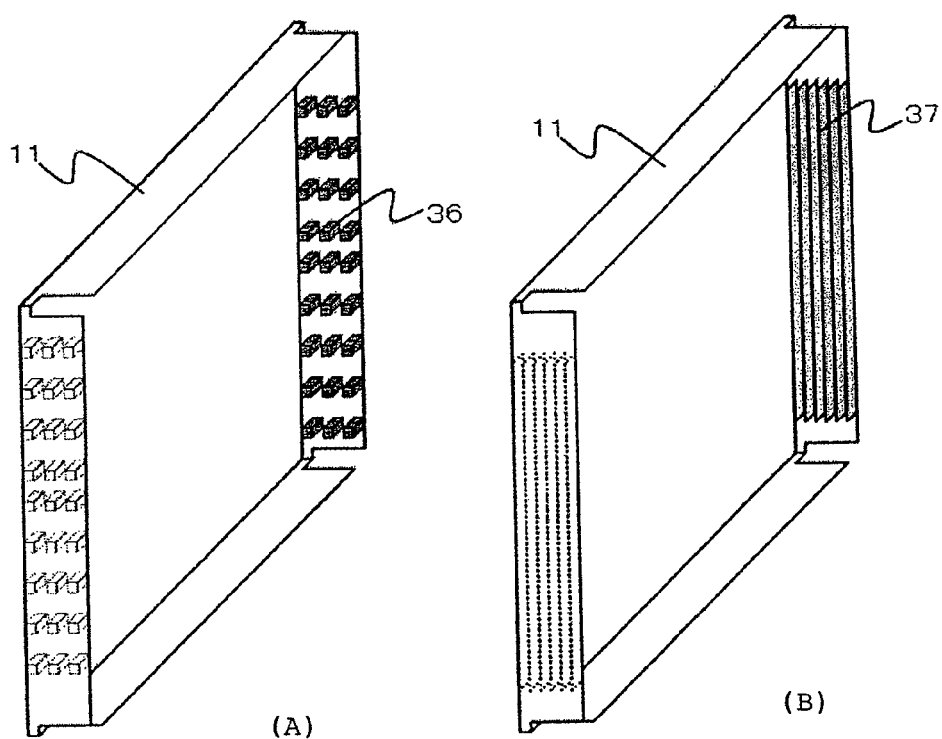
FIG. 15 shows diagrams depicting the types of projection structures on the inner side surfaces of the chassis box of the liquid crystal display device according to the second exemplary embodiment of the present invention.

In addition, for projections 35 mentioned above, which are provided on the inner surfaces of the right and left side walls of chassis box 11, pin-fin-shaped projections 36 as shown in FIG. 15(a) or plate-fin-shaped projections 37 as shown in FIG. 15(b) can be used.

Figure 16:
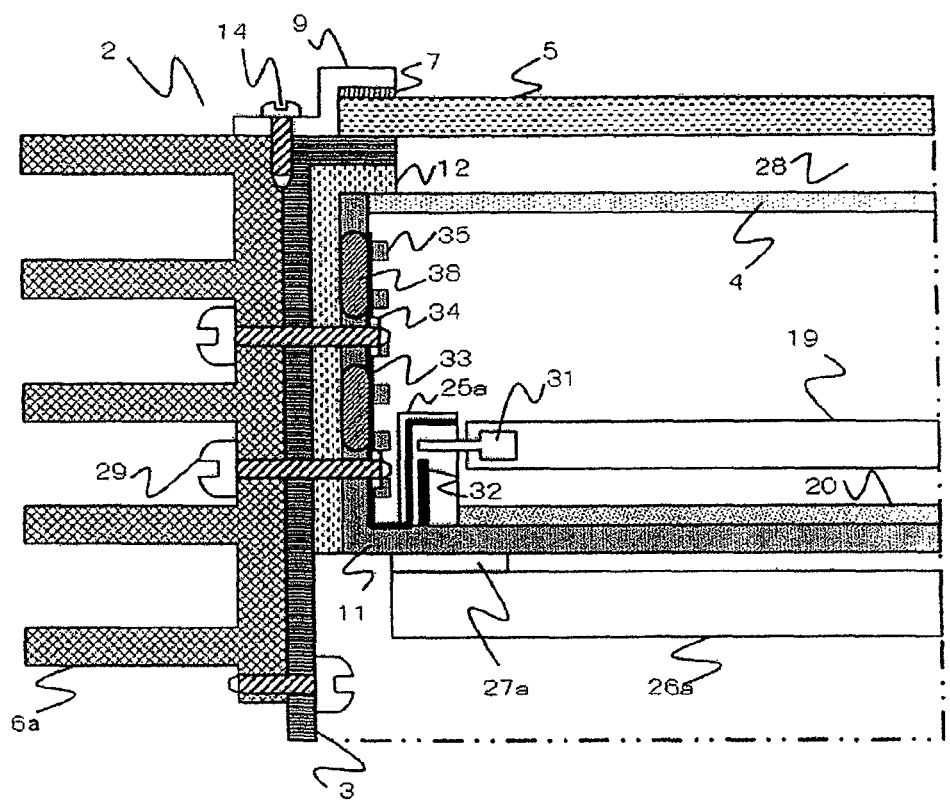
FIG. 16 is a diagram depicting a heat pipe structure of the liquid crystal display device according to the second exemplary embodiment of the present invention.
Figure 17:
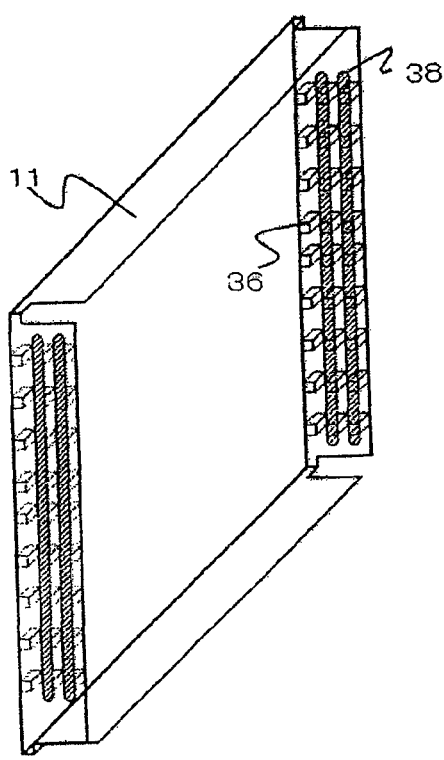
FIG. 17 is a diagram depicting a buried heat pipe structure of the liquid crystal display device according to the second exemplary embodiment of the present invention.

Next, the configuration for further reducing thermal resistance R3 in the configuration in FIG. 14 will be described with reference to FIG. 16.

Figure 14:
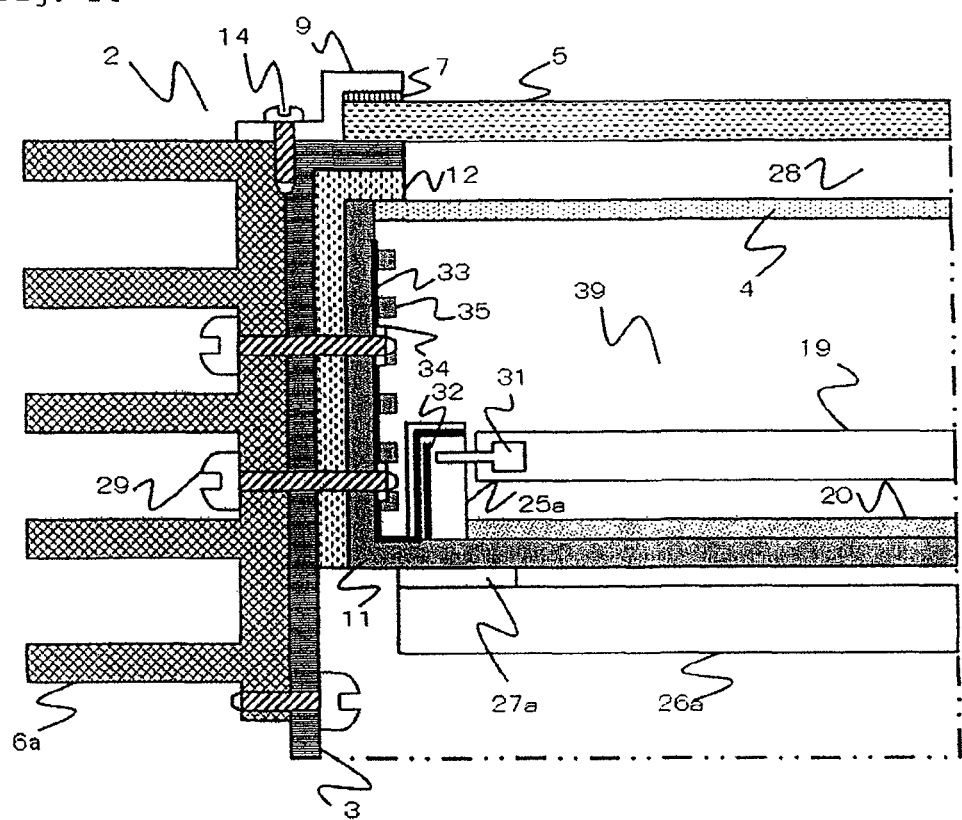
FIG. 14 is a diagram depicting a projection structure on the inner side surfaces of the right and left side walls of a chassis box of the liquid crystal display device according to the second exemplary embodiment of the present invention.

For the above-mentioned configuration in FIG. 14, heat pipes 38 are buried inside the right and left side walls of chassis box 11. Heat pipes 38 are extended over the inside of the side walls of chassis box 11 with a cooling medium filled thereinside. However, the heat pipes are arranged such that the locations of joint screws 29 are avoided.

With this configuration, the heat of high temperature air 39 inside display unit housing case 3 is transferred to the side walls of chassis box 11 through projections 35 on the inner side surfaces of chassis box 11, and then transferred in the vertical direction (perpendicular direction) and the rear direction of device 1 through heat pipes 38 inside the side walls of chassis box 19. Consequently, as compared with the configuration in FIG. 14, the amount of thermal resistance R3 is further reduced, and the heat dissipation effect of device 1 is further enhanced.

According to the invention shown by the individual embodiments, a liquid crystal display device is fabricated for preventing the penetration of dust or dirt and the attachment of water droplets such as rain to the surface of the liquid crystal panel and for preventing the surface of the liquid crystal panel from being damaged even by external impacts because of the collision of empty cans, thrown rocks, or the like, which are conventional problems. Then, the liquid crystal display device according to the present invention is a high-value-added LED device with respect to uniform image quality, high reliability, and longer lifetime and has a simple dustproof and drip proof structure and cooling structure. Accordingly, the device is superior in terms of a reduced profile, weight, and cost.

Further, each of the above-mentioned embodiments has been described as an example of liquid crystal display devices used for display devices installed on station platforms. Because the ratio of iron powder (conductive substance) contained in dust and dirt in the outside air on station platforms is higher than that of typical dust and dirt, such configurations are required such that importance is further placed on the dustproof and drip proof properties and such that a cooling capability is satisfied. However, the places, to which the liquid crystal display device according to the present invention is adapted, are not restricted to station platforms as long as places where these requirements exist. Furthermore, the cooling structure of the liquid crystal display device according to the present invention is applicable not only to liquid crystal display devices but also to other display devices.

Other Exemplary Embodiments

1) Another aspect of the present invention is a liquid crystal display device including a display unit housing case configured to house a light source unit and a display unit and an electronic component housing case configured to house an electronic component, and the liquid crystal display device is tightly closed and externally disposed with heat radiation fins.

2) In the liquid crystal display device according to 1), the display unit housing case is formed of a metal box having a fluorescent lamp as the light source unit and a liquid crystal panel as the display unit mounted therein, and a metal frame placed and laid over the sides of the box. The display unit housing case is housed inside the metal electronic component housing case. Then, the heat radiation fins are disposed on the right and left sides of the liquid crystal display device. Further, the liquid crystal display device has a thermal conduction path from the fluorescent lamp to the heat radiation fins, the thermal conduction path being formed by using a fluorescent lamp socket fixed on the inner side surface of the box for mounting the fluorescent lamp therein, the side wall of the box, the side wall of the frame, and the side wall of the electronic component housing case. It becomes possible to completely and tightly close the surface of the liquid crystal panel by providing such a heat dissipation path.

3) In the liquid crystal display device according to 2), the thermal conduction path is formed by that the side wall of the box, the side wall of the frame, the side wall of the electronic component housing case and the heat radiation fins are integrated in one piece, by using parts installing them from the inside of the electronic component housing case and parts installing them from the side of the heat radiation fins.

4) In the liquid crystal display device according to 3), the side surface of the fluorescent lamp socket comes into contact with the inner side surface of the box and fixed thereto.

5) In the liquid crystal display device according to 4), the fluorescent lamp socket has a thermal connector isolated from a current carrying unit inside the fluorescent lamp socket, and the thermal connector is connected to the bottom of the box.

6) In the liquid crystal display device according to 5), the fluorescent lamp socket has a heat radiation plate isolated from the current carrying unit, the heat radiation plate covering the outer frame of the fluorescent lamp socket, and the extending portion of the heat radiation plate is connected to the inner side surface of the box.

7) In the liquid crystal display device according to 6), the inner side surface of the side wall of the box has projections.

8) In the liquid crystal display device according to 7), the projections are made of a metal material such as copper or aluminum.

9) In the liquid crystal display device according to 7), the projections are pin-fin-shaped projections.

10) In the liquid crystal display device according to 7), the projections are plate-fin-shaped projections.

11) In the liquid crystal display device according to 7), a heat pipe buried inside the side wall of the box is further provided.

12) In the liquid crystal display device according to any one of 2) to 11), the electronic component housing case is a box having a black coating applied on the inner and outer surfaces thereof, the box having an opening in one side thereof. Then, the liquid crystal display device has a member for tightly closing the opening in the one side since the display unit housing case is housed inside the electronic component housing case, and a member for tightly closing the surface of the liquid crystal panel as the display unit which is housed inside the display unit housing case with a transparent non-reflective plate. With this configuration, it becomes possible to completely and tightly close the overall liquid crystal display device.

13) In the liquid crystal display device according to 12), the member for tightly closing the opening has a cover for covering the opening in the one side, a dustproof sheet provided between a circumferential surface defining the opening and the cover, and a joint screw having a waterproof material. Further, the member for tightly closing the surface of the liquid crystal panel has a cover for covering the outer circumferential portion of the transparent non-reflective plate, a dustproof sheet provided between the cover and the transparent non-reflective plate, and a joint screw having a waterproof material.

14) In the liquid crystal display device according to any one of 2) to 13), a part of a quantity of heat generated from the fluorescent lamp housed inside the display unit housing case is guided to the right and left sides of the liquid crystal display device by the thermal conduction path, and dissipated into the air around the liquid crystal display device by natural air-cooling.

With this configuration, an effect can be obtained such that the temperature of the liquid crystal panel is reduced when the surface of the liquid crystal panel is tightly closed with the transparent non-reflective plate.

15) In the liquid crystal display device according to 14), when an inverter circuit board and a control circuit board are mounted on the rear side of the display unit housing case, a part of a quantity of heat generated from the inverter circuit board and the control circuit board is guided to the right and left sides of the liquid crystal display device by the thermal conduction path, and dissipated into air around the liquid crystal display device by natural air-cooling.

With this configuration, it becomes possible for the amount of heat that is radiated toward the surface of the liquid crystal panel to be reduced and for the surface of the liquid crystal panel to be tightly closed with the transparent non-reflective plate.

As discussed above, some embodiments have been shown for the purpose of explaining the present invention. However, it goes without saying that the invention of the present application is not restricted to these embodiments, which can be variously modified and implemented without deviating from the scope of the technical teachings of the invention.

This application claims the benefit of the right of priority on the basis of Patent Applications Nos. 2008-179006 filed in Japan on Jul. 9, 2008 and 2008-186177 on Jul. 17, 2008, the entire disclosures of which are hereby incorporated herein by reference.

The invention claimed is:

1. A liquid crystal display device comprising:
a display unit housing case configured to house a light source unit and a display unit; and
an electronic component housing case configured to house an electronic component, wherein said liquid crystal display device is tightly closed, said liquid crystal display device being externally disposed with heat radiation fins,
wherein
said display unit housing case consists of a metal box in which a fluorescent lamp as said light source unit and a liquid crystal panel as said display unit are mounted, and a metal frame placed and laid over sides of said box, said display unit housing case being housed inside said metal electronic component housing case,
said heat radiation fins are disposed on right and left sides of said liquid crystal display device, and
said liquid crystal display device has a thermal conduction path from said fluorescent lamp to said heat radiation fins, the thermal conduction path being formed by using a fluorescent lamp socket fixed on an inner side surface of said box for mounting said fluorescent lamp therein, a side wall of said box, a side wall of said frame, and a side wall of said electronic component housing case.

2. The liquid crystal display device according claim 1, wherein
said thermal conduction path is formed by the side wall of said box, the side wall of said frame, the side wall of said electronic component housing case and said heat radiation fins being integrated in one piece, by using a part installing together them from the inside of said electronic component housing case and a part installing together them from the side of said heat radiation fins.

3. The liquid crystal display device according to claim 2, wherein a side surface of said fluorescent lamp socket comes into contact with the inner side surface of said box and fixed thereto.

4. The liquid crystal display device according to claim 3, wherein said fluorescent lamp socket has a thermal connector that is isolated from a current carrying unit inside said fluorescent lamp socket, and
said thermal connector is connected to a bottom of said box.

5. The liquid crystal display device according to claim 4, wherein said fluorescent lamp socket has a heat radiation plate that is isolated from said current carrying unit, the heat radiation plate covering an outer frame of said fluorescent lamp socket, and an extending portion of said heat radiation plate is connected to the inner side surface of said box.

6. The liquid crystal display device according to claim 5, wherein the inner side surface of the side wall of said box has projections.

7. The liquid crystal display device according to claim 6, wherein said projections are made of copper or aluminum.

8. The liquid crystal display device according to claim 6, wherein said projections are pin-fin-shaped projections.

9. The liquid crystal display device according to claim 6, wherein said projections are pin-fin-shaped projections.

10. The liquid crystal display device according to claim 7, further comprising a heat pipe buried inside the side wall of said box.

11. The liquid crystal display device according to claim 1, wherein
said electronic component housing case is a box having a black coating applied on inner and outer surfaces thereof, the box having an opening in one side thereof, and said liquid crystal display device has:
a member for tightly closing the opening in said one side since said display unit housing case is housed inside said electronic component housing case; and
a member for tightly closing a surface of the liquid crystal panel as said display unit which is housed inside said display unit housing case with a transparent non-reflective plate.

12. The liquid crystal display device according to claim 11, wherein
the member for tightly closing said opening has a cover for covering the opening in said one side, a dustproof sheet provided between a circumferential surface defining said opening and said cover, and a joint screw having a waterproof material, and
the member for tightly closing the front surface of said liquid crystal panel has a cover for covering an outer circumferential portion of said transparent non-reflective plate, a dustproof sheet provided between said cover and said transparent non-reflective plate, and a joint screw having a waterproof material.

13. The liquid crystal display device according to claim 1, wherein
   a part of a quantity of heat generated from said fluorescent lamp housed inside said display unit housing case is guided to the right and left sides of the liquid crystal display device by said thermal conduction path, and dissipated into air around the liquid crystal display device by natural air-cooling.

14. The liquid crystal display device according to claim 13, wherein
   an inverter circuit board and a control circuit board are mounted on a rear side of said display unit housing case, and
   a part of a quantity of heat generated from said inverter circuit board and said control circuit board is guided to the right and left sides of the liquid crystal display device by said thermal conduction path, and dissipated into air around the liquid crystal display device by natural air-cooling.

* * * * *

UNITED STATES PATENT AND TRADEMARK OFFICE
CERTIFICATE OF CORRECTION

| | | |
|---|---|---|
| PATENT NO. | : 8,514,364 B2 | Page 1 of 1 |
| APPLICATION NO. | : 13/003268 | |
| DATED | : August 20, 2013 | |
| INVENTOR(S) | : Kazuyuki Mikubo et al. | |

It is certified that error appears in the above-identified patent and that said Letters Patent is hereby corrected as shown below:

In the Claims

Column 16, Line 38: In Claim 9, delete "pin-fin-shaped" and insert -- plate-fin-shaped --

Column 16, Line 39: In Claim 10, delete "claim 7," and insert -- claim 6, --

Signed and Sealed this
Sixteenth Day of December, 2014

Michelle K. Lee
*Deputy Director of the United States Patent and Trademark Office*